(12) United States Patent
Scherer et al.

(10) Patent No.: US 8,080,468 B2
(45) Date of Patent: Dec. 20, 2011

(54) METHODS FOR FABRICATING PASSIVATED SILICON NANOWIRES AND DEVICES THUS OBTAINED

(75) Inventors: Axel Scherer, Laguna Beach, CA (US); Sameer Walavalkar, Los Angeles, CA (US); Michael D. Henry, Altadena, CA (US); Andrew P. Homyk, South Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 12/822,109

(22) Filed: Jun. 23, 2010

(65) Prior Publication Data

US 2011/0031470 A1     Feb. 10, 2011

Related U.S. Application Data

(60) Provisional application No. 61/220,980, filed on Jun. 26, 2009.

(51) Int. Cl.
  *H01L 21/00*  (2006.01)
  *H01L 21/20*  (2006.01)
  *H01L 21/36*  (2006.01)
(52) U.S. Cl. ..... 438/586; 438/23; 438/479; 257/E21.19; 977/762
(58) Field of Classification Search ............ 438/23, 438/586, 479; 257/E21.19; 977/762
See application file for complete search history.

(56) References Cited

U.S. PATENT DOCUMENTS

| | | | |
|---|---|---|---|
| 7,419,908 B2 | 9/2008 | Green | |
| 2004/0071951 A1 | 4/2004 | Jin | |
| 2004/0108298 A1 | 6/2004 | Gao | |
| 2006/0063368 A1 | 3/2006 | Sharma | |
| 2006/0118975 A1 | 6/2006 | Koenenkamp | |
| 2007/0126079 A1 | 6/2007 | Shioya et al. | |
| 2008/0035983 A1 | 2/2008 | Sandhu et al. | |
| 2008/0036038 A1* | 2/2008 | Hersee et al. | 257/615 |
| 2008/0142970 A1 | 6/2008 | Evans et al. | |
| 2008/0156369 A1 | 7/2008 | Ko et al. | |
| 2008/0230802 A1 | 9/2008 | Bakkers et al. | |
| 2010/0213579 A1 | 8/2010 | Henry | |
| 2010/0215543 A1 | 8/2010 | Henry | |
| 2011/0020960 A1 | 1/2011 | Henry | |
| 2011/0031470 A1 | 2/2011 | Scherer | |

FOREIGN PATENT DOCUMENTS

| | | |
|---|---|---|
| JP | 2004-193525 | 7/2004 |
| JP | 2007-194646 | 8/2007 |
| JP | 2008-130712 | 5/2008 |
| WO | 2007-077842 | 7/2007 |

OTHER PUBLICATIONS

Chang, Y.F. ., Fabrication of high-aspect-ratio silicon nanopillar arrays with the conventional reactive ion etching technique, *Appl. Phys. A*. 86, 193-196 (2007).

(Continued)

*Primary Examiner* — Alexander Ghyka
*Assistant Examiner* — Seahvosh Nikmanesh
(74) *Attorney, Agent, or Firm* — Steinfl & Bruno LLP (57) ABSTRACT

Methods for fabricating passivated silicon nanowires and an electronic arrangement thus obtained are described. Such arrangements may comprise a metal-oxide-semiconductor (MOS) structure such that the arrangements may be utilized for MOS field-effect transistors (MOSFETs) or opto-electronic switches.

19 Claims, 6 Drawing Sheets

OTHER PUBLICATIONS deBoer, M.J. et al., Guidelines for Etching Silicon MEMS Structures Using Fluorine High-Density Plasmas at Cryogenic Temperatures, *J. Microelectromech. Syst.* 1, 385 (2002).

Kayes, B.M. et al., Comparison of the device physics principles of planar and radial p-n junction nanorod solar cells, *J. Appl. Phys* 97, 114302 (2005).

Kelzenberg, M.D. et al., Single-Nanowire Si Solar Cells, *Nano Lett* 8, 710-714 (2008).

Moser, B. et al., Strength and fracture of Si micropillars: A new scanning electron microscopy-based micro-compression test, *J. Mater. Res.* 22, 1004-1011 (2007).

Oxford Plasma Technology Applications Engineering Group "Plasmalab" Process Data Sheet, 'Bosch' Silicon Etch Process, 'Cryo' Silicon Etch Process, and Silicon Etch (2002).

Rangelow, I.W., Critical tasks in high aspect ratio silicon dry etching for microelectromechanical systems, *J. Vac. Sci. Technol. A* 21, 1550-1562 (2003).

Sainiemi, L. et al., 2007 *J. Vac. Sci. Technol. B* 25 801-807.

Sainiemi, L. et al., Rapid fabrication of high aspect ratio silicon nanopillars for chemical analysis, *J. Vac. Sci. Technol. B* 18, 505303 (2007).

Sajjad, R.N. et al., Electronic properties of a strained <100> silicon nanowire, *J. Appl. Phys.* 105, 044307 (2009).

Singh, N. et al., High-Performance Fully Depleted Silicon Nanowire (Diameter ≦ 5 nm) Gate-All-Around CMOS Devices, *IEEE. Electron Device Lett* 27, 383-386 (2006).

Welch, C.C. et al., Silicon etch process options for micro- and nanotechnology using inductively coupled plasma, *Microelectron. Eng* 83 1170-1173 (2006).

Williams, K.R. et al., Etch Rates for Micromachining Processing—Part II, *J. Microelectromech. Syst.* 12, 761-778 (2003).

Yeom, J. et al., Maximum achievable aspect ratio in deep reactive ion etching of silicon due to aspect ratio dependent transport and the microloading effect, *J. Vac. Sci. Technol. B* 23, 2319-2329 (2005).

PCT International Search Report issued for PCT Application PCT/US2010/039702 filed on Jun. 23, 2010 in the name of California Institute Ot Technology et al.

PCT Written Opinion issued for PCT Application PCT/US2010/039702 filed on Jun. 23, 2010 in the name of California Institute Ot Technology et al.

PCT International Search Report issued for PCT Application PCT/US2010/025256 filed on Feb. 24, 2010 in the name of California Institute Ot Technology et al.

PCT Written Opinion issued for PCT Application PCT/US2010/025256 filed on Feb. 24, 2010 in the name of California Institute Ot Technology et al.

PCT International Search Report issued for PCT Application PCT/US2010/025261 filed on Feb. 24, 2010 in the name of California Institute Ot Technology et al.

PCT Written Opinion issued for PCT Application PCT/US2010/025261 filed on Feb. 24, 2010 in the name of California Institute Ot Technology et al.

PCT International Search Report issued for PCT Application PCT/US2010/057301 filed on Nov. 18, 2010 in the name of California Institute Ot Technology et al.

PCT Written Opinion issued for PCT Application PCT/US2010/057301 filed on Nov. 18, 2010 in the name of California Institute Ot Technology et al.

Restriction Requirement issued for U.S. Appl. No. 12/712,097, filed on Feb. 24, 2010 in the name of Henry et al. mail date: Jul. 13, 2011.

Scheible, D., et al., Silicon Nanopillars for Mechanical Single-electron Transport, Applied Physics Letters 2004, 84: 4632-4634.

Kim, H., et al., Field Emission From a Single Nanomechanical Pillar, Nanotechnology 2007, 18: 065201-1 065201-4.

Lauhon, L., et al., Epitaxial Core-shell and Core-multishell Nanowire Heterostructures, Nature 2002, 420: 57-61.

Nassiopoulos, A., et al., Electroluminescent Device Based on Silicon Nanopillars, Applied Physics Letters 1996, 69: 2267-2269.

Photopoulos, P., et al. Photoluminescence from Nanocrystalline Silicon in Si/SiO2 Superlattices, Applied Physics Letters 2000, 76: 3588-3590.

Bogglid, P., et al., Fabrication and Actuation of Customized Nanotweezers with a 25 nm Gap, Nanotechnology 2001, 12: 331-335.

Tang, Z., et al., Finite Temperature Quasicontinuum Method for Multiscale Analysis of Silicon Nanostructures, Physical Review 2006, 74: 064100-1 061400-29.

Singh, J., Electronic and Optoelectronic Properties of Semiconductor Structures, in Electronic and Optoelectronic Properties of Semiconductor Structures, 2003, Cambridge University Press, Chapter 1.4 Strained heterostructures, 26-31.

Hashemi, P., et al., Asymmetric Strain in Nanoscale Patterned Strained-Si/strained-Ge/strained-Si Heterostructures on Insulator, Applied Physics Letters 2007, 91: 083109-1 083109-3.

Jacobsen, R., et al., Strained Silicon as a New Electro-optic Material, Nature 2006, 441: 199-202.

Teh, W., et al., Cross-linked Pmma as a low Dimensional Sacrificial Layer, Journal of Electromechanical Systems 2003, 12: 641-648.

Timoshenko, S., Analysis of Bi-metal Thermostats, Journal of the Optical Society of America 1925, 11: 1235-1257.

Henry, M., et al., Alumina etch masks for fabrication of high-aspect-ratio silicon micropillars and naopillars, Nanotechnology 2009, 20: 255305-1-255305-4.

Wiener, H., Vapor pressure-temperature relationships among the branched paraffin hydrocarbons, Acs 1948, 425-430.

Chirico, R., et al., Vapor pressure on-Alkanes revisted. New high-precision vapor pressure data on nDecane, n- Elcosane, and n-Octacosane, J. Chem. Eng. Data 1989, 34: 149-56.

Ambrose, D., et al., Vapour pressures up to their critical temperatures of normal alkanes and 1- alkanois, Pure & Applied Chemistry 1989, 61: 1395-1403.

Ebron, V., et al., Fuel-powered artificial muscles, Science 2006, 311: 1580-1584.

Cassie, a., et al., Wettability of porous surfaces, Transactions of the Faraday Society 1944, 40: 546-551.

Gao, L., et al., the "lotus effect" explained: Two reasons why two length scales of topography are important, Langmuir 2006, 22: 2966-29967.

Li, H., et al., Investigation of capacitive humidity sensing behavior of silicon nanowires, Physica E 2009, 41: 600-604.

Kuan, W., et al., the preparation of superhydrophobic surfaces of hierarchical silicon nanotube structures, Nanotechnology 2009, 20: 035605-1-035605-8.

Hon, K., et al., Periodically Poled Silicon, Applied Physics Letters 2009, 94: 091116-1 091116-3.

Zailer, I., et al., Crosslinked PMMA as a High-resolution Negative Resist for Elctron Beam Lithography and Applications for Physics of lowdimensional Structures, Semiconductor Sci. Technol. 1996, 11: 1235-1238.

\* cited by examiner

METHODS FOR FABRICATING PASSIVATED SILICON NANOWIRES AND DEVICES THUS OBTAINED

CROSS REFERENCE TO RELATED APPLICATIONS

The present application claims priority to U.S. Provisional Application No. 61/220,980, filed on Jun. 26, 2009 which is incorporated herein by reference in its entirety. The present application may also be related to U.S. patent application Ser. No. 12/712,097 for 'Methods for Fabricating High Aspect Ratio Probes and Deforming High Aspect Ratio Nanopillars and Micropillars' filed on Feb. 24, 2010, and U.S. patent application Ser. No. 12/711,992 for 'Methods for Fabrication of High Aspect Ratio Micropillars and Nanopillars' filed on Feb. 24, 2010, the disclosures of which are also incorporated herein by reference in their entirety.

STATEMENT OF GOVERNMENT GRANT

The U.S. Government has certain rights in this invention pursuant to Grant No. HR0011-01-1-0054 awarded by Darpa and Grant No. DMR0520565 awarded by the National Science Foundation.

FIELD

The present disclosure relates to silicon nanowires. Moreover in particular, it relates to methods for fabricating passivated silicon nanowires and devices thus obtained.

BACKGROUND

Defining high aspect ratio structures with controllable sidewalls in silicon has become increasingly important both in the nanometer and micrometer scale for solar cells, microelectronic devices, and chemical analysis. High aspect ratio micrometer pillars are used for solar cell investigations while nanometer scale high aspect ratio pillars are enabling fundamental investigations in theories of nanoscale pillar stress mechanics, silicon based lasers, and nanoscale electronic devices such as finFETs. Currently various nanofabrication techniques exist that rely on self assembly or bottom-up processing. Some top-down processing enabling reproducibility in nanofabrication can also be found.

Further applications are high surface area chemical sensors, mechanical oscillators and piezo-resistive sensors. High aspect ratio pillars with diameters between 50-100 nm could prove useful for core-shell type plasmonic resonators while pillars with sub-10 nm diameters have shown promising light emission characteristics.

SUMMARY

According to a first aspect, a method for fabricating an electronic arrangement, comprising providing one or more nanoscale pillars, coating the one or more nanoscale pillars with an insulator, depositing a first conductive layer on the insulator, coating a portion of the first conductive layer with a dielectric, removing an end portion of the first conductive layer and the insulator, thereby making electrically accessible a portion of the one or more nanoscale pillars, and depositing a second conductive layer on the dielectric, the second conductive layer contacting the electrically accessible portion of the one or more nanoscale pillars.

According to a second aspect, a method for fabricating an electronic arrangement, comprising providing one or more nanoscale pillars, coating the one or more nanoscale pillars with an insulator, coating the insulator with a dielectric, removing an end portion of the insulator, thereby making electrically accessible a portion of the one or more nanoscale pillars, and depositing a conductive layer on the dielectric, the conductive layer contacting the electrically accessible portion of the one or more nanoscale pillars.

According to a third aspect, a method for fabricating an electronic arrangement, comprising providing one or more nanoscale pillars, coating the one or more nanoscale pillars with an insulator, removing the insulator portion in contact with the nanoscale pillar, coating remaining insulator portion and an exposed portion of the nanoscale pillar with a first conductive layer, coating the conductive layer with a dielectric, removing an end portion of the first conductive layer, thereby making electrically accessible a portion of the one or more nanoscale pillars, and depositing a second conductive layer on the dielectric, the second conductive layer contacting the electrically accessible portion of the one or more nanoscale pillars.

According to a fourth aspect, an electronic arrangement comprising a plurality of insulator covered semiconductor nanoscale pillar structures substantially perpendicular to a planar surface, and a conductive layer coated on the insulator covered semiconductor nanoscale pillar structures.

According to a fifth ascept, an electronic arrangement comprising an insulator covered semiconductor substrate, a plurality of nanoscale pillar structures on the substrate, substantially perpendicular to a planar surface, and a conductive layer covering the insulator and the nanoscale pillar structures, wherein the conductive layer is devoid of an end portion thereof, so that end portions of the nanoscale pillar structures are electrically accessible.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIGS. 1A-1F shows fabrication steps of a gate on a nanoscale pillar in accordance with an embodiment of the present disclosure. In particular:

FIGS. 2A-2E shows fabrication steps of a metal contact on a nanoscale pillar in accordance with a further embodiment of the present disclosure. In particular:

FIG. 3A-3F show fabrication steps of a gate on a metal-semiconductor (MES) nanoscale pillar in accordance with a further embodiment of the present disclosure. In particular:

DETAILED DESCRIPTION

In what follows, methods for fabrication of a passivated nanoscale electronic component are described in accordance with various embodiments of the present disclosure. Nanoscale size pillars can be fabricated by way of example and not of limitation, by performing standard photolithographic or electron-beam lithographic techniques, self-assembly to prepare masks for arrays, use of lithography to pattern catalysts and bottom-up techniques such as vapor-liquid-solid (VLS) growth instead of etching. The term 'nanoscale' is defined herein to be any structure between 1 nm and 500 nm in width. The term 'pillar' is defined as a substantially upright shaft where the height is much greater than the width, e.g., 5-10 times greater than the width.

Photolithography is a process used in microscale fabrication to selectively remove parts of a film or bulk of a substrate. It uses light to transfer a geometric pattern from a photo mask to a light-sensitive chemical called a photo resist on the substrate. Similarly, electron beam lithography is a process where a beam of electrons are scanned in a patterned fashion to the electron-beam resist. This is followed by a series of chemical treatments in a process similar to dark room processing for photography. The photo or electron-beam resists can be utilized as a mask directly, or utilized to pattern a harder mask which can have better resilience as compared to masking directly. In accordance with an exemplary embodiment, the applicants utilized an electron-beam resist to fabricate a patterned aluminum oxide (alumina) mask, then removed the electron-beam resist and utilized the patterned alumina during etching. Lithography and highly anisotropic etching enables a routine fabrication of 30-50 nm nanostructures in silicon with over 40:1 aspect ratios. Such structures can be further reduced in diameter by a subsequent thermal oxidation, wherein the oxidation process can be designed to self-terminate such that nanoscale pillars below 10 nm in width can be defined, allowing wide processing latitude. Additionally, control of the oxidation process can produce silicon channels which are strained. Moreover, the nanoscale pillars can be fabricated with tight control over gate length by initially fabricating the nanoscale pillars to a length substantially taller than required, then depositing a precisely controlled protective spacer layer, and subsequently cleaving or polishing the protruding portions of the nanoscale pillars to obtain tightly controlled gate lengths. Controlling the thickness of the protective spacer layer can be accomplished with a higher degree of precision as compared to defining lithographic features at nanoscale levels. The applicants used transmission and scanning electron microscopy to observe the nanoscale pillars.

FIGS. 1A-1F show various steps of fabricating a passivated nanoscale electronic component in accordance with the disclosure. The person skilled in the art will understand that the number of such steps is only indicative and that the process can occur in more or fewer steps according to the various embodiments. For the sake of simplicity, throughout the present disclosure, the term 'pillar' intends to indicate nanoscale pillars.

Figure 1A:
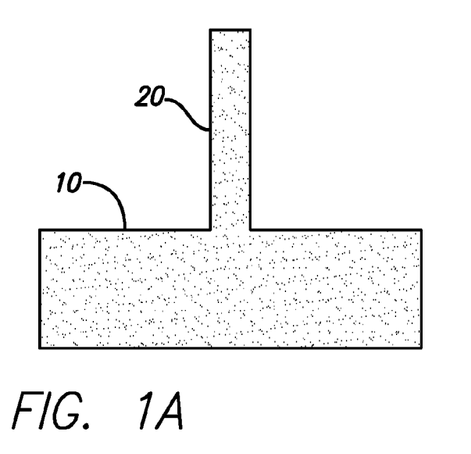
FIG. 1A shows an exemplary nanoscale pillar substrate.

FIG. 1A is a cross-sectional view of a patterned, or etched substrate (10) comprising a substantially vertical nanoscale pillar (20). By way of example and not of limitation, the substrate (10) and the pillar (20) are made of silicon (Si). As an alternative to this embodiment, the vertical nanoscale pillars can be fabricated on silicon-on-insulator (SOI) instead of bulk silicon structure.

Figure 1B:
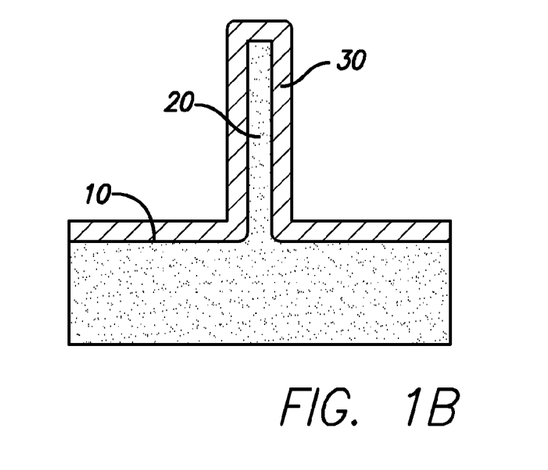
FIG. 1B shows an exemplary insulator passivated nanoscale pillar.

FIG. 1B is a further cross-sectional view where the substrate (10) and the pillar (20) are covered by an insulator or oxide layer (30), e.g., silicon dioxide ($SiO_2$) or other dielectrics. As an alternative embodiment, a conductor can be utilized instead of an insulator in direct contact with the substrate to produce a metal-semiconductor (MES) structure useful for a MES Field-Effect Transistor (MESFET). The oxidation process introduces volume expansion within the nanoscale pillars where the vertical nanoscale pillar structure further enables significant volume expansion in a lateral and vertical direction. Exposing the silicon embedded in the oxide to very high strain (e.g., 2.5-3.0%) enhances the ability of this device to efficiently emit light which can be utilized, for example, for opto-electronic switching.

Figure 1C:
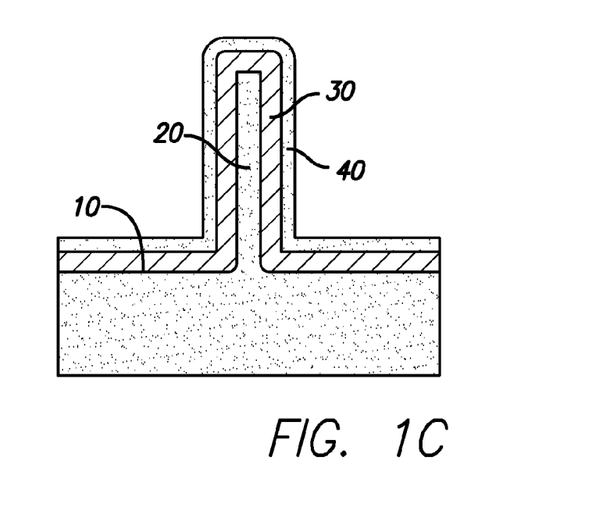
FIG. 1C shows an exemplary insulator passivated nanoscale pillar coated with a first conductor.

FIG. 1C is a further cross-sectional view where the oxide layer (30) on the substrate (10) and the pillar (20) are covered by a layer of a first conductive material (40), e.g., gold (Au) or silver (Ag). According to an embodiment of the disclosure, the first conductive material can introduce electrostatic gates on an exterior perimeter and an end portion of the pillar (20) to modulate the conductivity and defines a vertical conductive layer (40)—oxide (30)—semiconductor (20) (MOS) structure. Such embodiment features a very low threshold voltage (e.g., on the order of 0.5 V) and high on/off ratio with low sub-threshold slopes (e.g., less than 60 mV/decade), as the first conductive layer (40) can be deposited to surround the silicon nanoscale pillar (20) on all sides, thereby enabling electrostatic control of a channel. A person skilled in the art of semiconductor fabrication will recognize an opportunity to integrate devices with very high density as a dimension of a conducting channel inside the pillar (20) is nanometers in width.

Figure 1D:
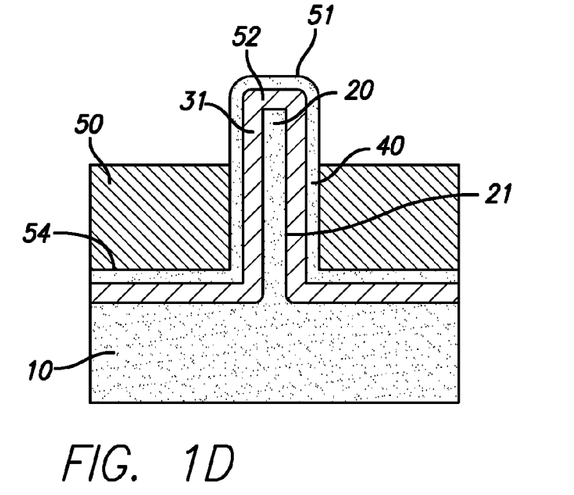
FIG. 1D shows an exemplary insulator passivated nanoscale pillar coated with the first conductor, wherein the conductor is coated with a dielectric.

FIG. 1D is a further cross-sectional view where a portion of the first conductive layer (40) on the oxide layer (30) on a vertical portion of the pillar (20) is coated by a layer of a dielectric material (50), e.g., photo resist, benzocyclobutene (BCB), or poly methyl methacrylate (PMMA). The dielectric material (50) protects the covered portions of the first conductive layer (40) and the oxide layer (30) to allow selective removal of the first conductive layer (40) and the oxide layer (30) in the next step.

Figure 1E:
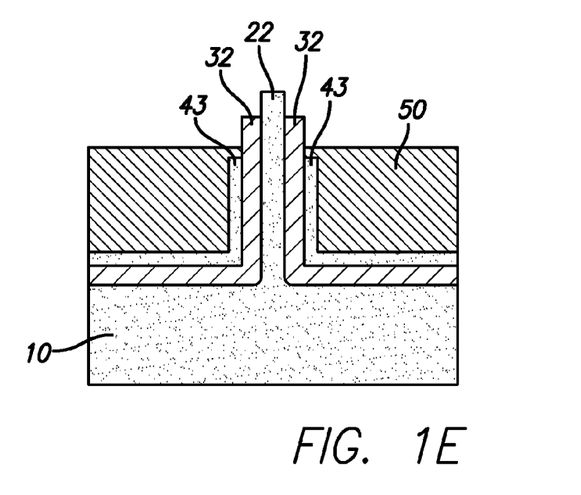
FIG. 1E shows an exemplary insulator passivated nanoscale pillar coated with the first conductor, wherein the first conductor is coated with a dielectric, and an end portion of the first conductor exposed above the dielectric is removed.

FIG. 1E is a further cross-sectional view where the unprotected portions of the oxide (31) and the first conductive layer (51) from FIG. 1D are removed from an end portion of the nanoscale pillar (20) for example by a process such as etching or chemical-mechanical polishing (CMP). The first conductive layer (40) and the oxide layer (30) on a lower portion of the nanoscale pillar (20) and a portion on the substrate are not removed, as the dielectric layer (50) acts as a buffer to protect such portions from being removed. After the removal, a protruding portion (22) of the silicon nanoscale pillar (20) and protruding portions (32) of the oxide layer are exposed, and an exposed portion of the first conductive layer (43) are coated with the dielectric layer to allow for further fabrication in the next steps to form, for example, the source or the drain of a FET.

Figure 1F:
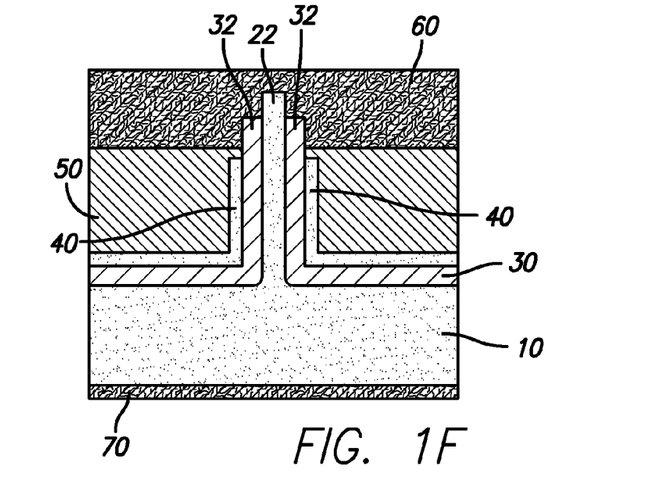
FIG. 1F shows an exemplary insulator passivated nanoscale pillar coated with the first conductor, wherein the first conductor is coated with a dielectric, and an end portion of the first conductor exposed above the dielectric is removed, and the exposed end portion of the nanoscale pillar and conductor are coated with a second conductor.

FIG. 1F is a further cross-sectional view where a second conductive layer (60) is coated, making contact with the dielectric (50), the end portion of the oxide (32) and the end portion of the nanoscale pillar (22). The second conductive layer (60) does not come in contact with the first conductive layer (40), and a backside contact (70) is present on the substrate (10), opposite a side of the insulator (30).

The first conductive material utilized to create the gate material in FIG. 1D can be chosen such that its plasmon resonance coincides with a band gap energy of the silicon nanoscale pillar, enabling the gate material to emit light as an opto-electronic transistor. The applicants observed that a blue-shift of a bandstructure places the band gap of a silicon quantum wire at 2 eV or 600-700 nm wavelength, where by way of example and not of limitation, gold or silver are matched as a Plasmon resonant material.

According to various embodiments in this disclosure, the strain from the oxidation process can alter a band structure of the silicon of the nanoscale pillars, further enhancing its light emitting property to generate an efficient light emitter for opto-electronic switching.

According to various embodiments in this disclosure, the vertical geometry of the transistor can be, but is not limited to, a variety of vertical field-effect transistors (FETs) such as metal-oxide-semiconductor field-effect transistor (MOSFET), metal-semiconductor FET (MESFET), junction gate FET (JFET), or by removing the dielectric to expose the gate and act as a sensor. Referring to FIG. 1F, the substrate (10) and the second conductive layer (60) represent a source and a drain (or vice versa) of the MOSFET, while the portions (32) of the oxidation layer represent the gate of the MOSFET.

An alternative embodiment of forming a conductive contact to the nanoscale pillars can be provided. Such embodiment is a sequence of steps shown in FIGS. 2A-2E. According to such embodiment, the layer (250) of dielectric material (e.g., photo resist) is deposited right after deposition of the oxide layer (230) and a means to expose the top portion of the nano scale pillar (222) (e.g., etching or chemical-mechanical polishing (CMP)) is performed, following which a conductive contact (260) is provided on top of the nanoscale pillar (222).

Figure 2A:
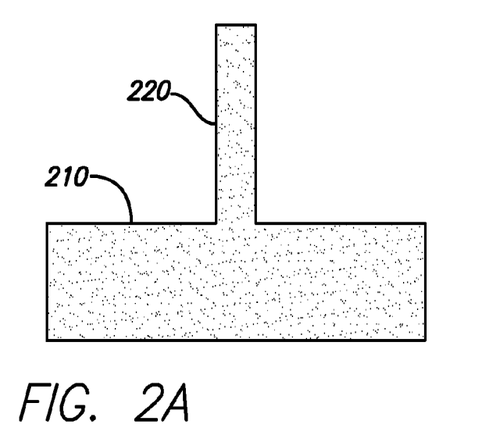
FIG. 2A shows an exemplary nanoscale pillar substrate.
Figure 2B:
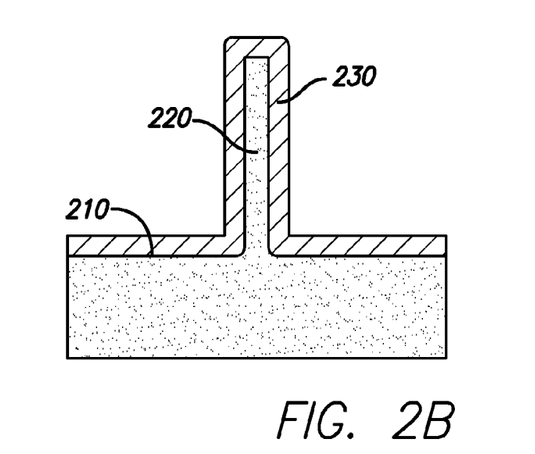
FIG. 2B shows an exemplary insulator passivated nanoscale pillar.

FIGS. 2A-2B are cross-sectional views of the nanoscale pillar on a substrate (210) where the nanoscale pillar (220) is covered by an insulator (230), as disclosed in FIGS. 1A-1B of this embodiment.

Figure 2C:
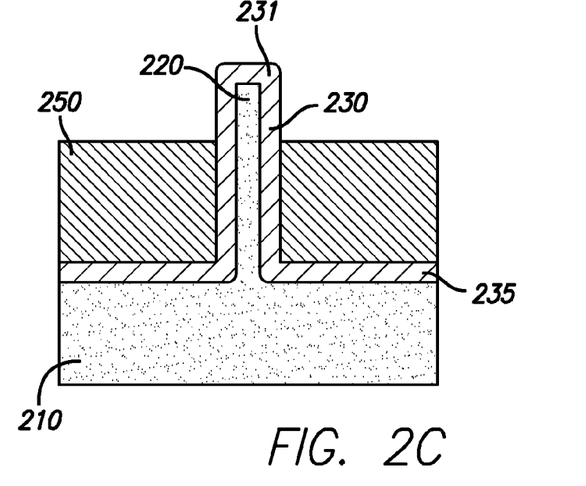
FIG. 2C shows an exemplary insulator passivated nanoscale pillar coated with a dielectric.

FIG. 2C is a further cross-sectional view where the nanoscale pillar (220) is coated with the dielectric layer (250) on the planar portion of the insulator (235), wherein an end portion of the insulator (231) coated on the nanoscale pillar (220) protrudes from the dielectric layer (250).

Figure 2D:
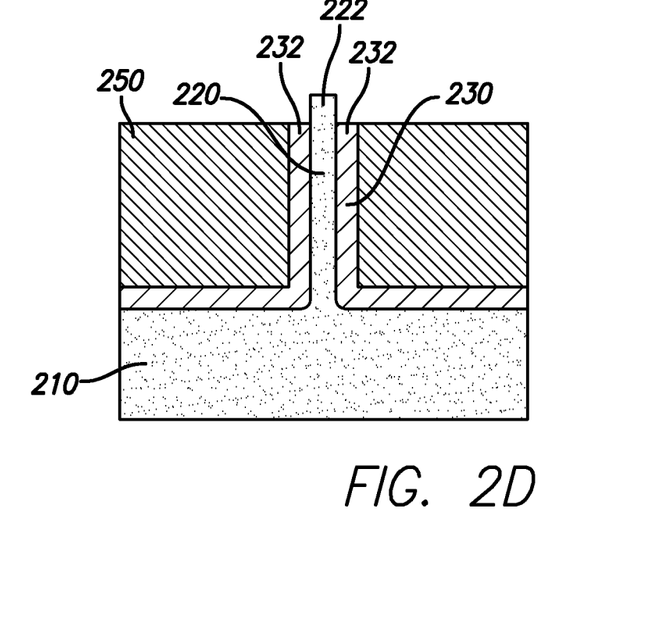
FIG. 2D shows an exemplary insulator passivated nanoscale pillar coated with a dielectric, and an end portion of the nanoscale pillar protrudes from a removed portion of the insulator, above the dielectric.

FIG. 2D is a further cross-sectional view where the unprotected portions of the insulator (231) from FIG. 2C are removed from an end portion of the nanoscale pillar (220). After the removal, a protruding portion (222) of the nanoscale pillar (220) and protruding portions (232) of the insulator (230) are exposed to allow for further fabrication in the next step to form, for example a metal contact.

Figure 2E:
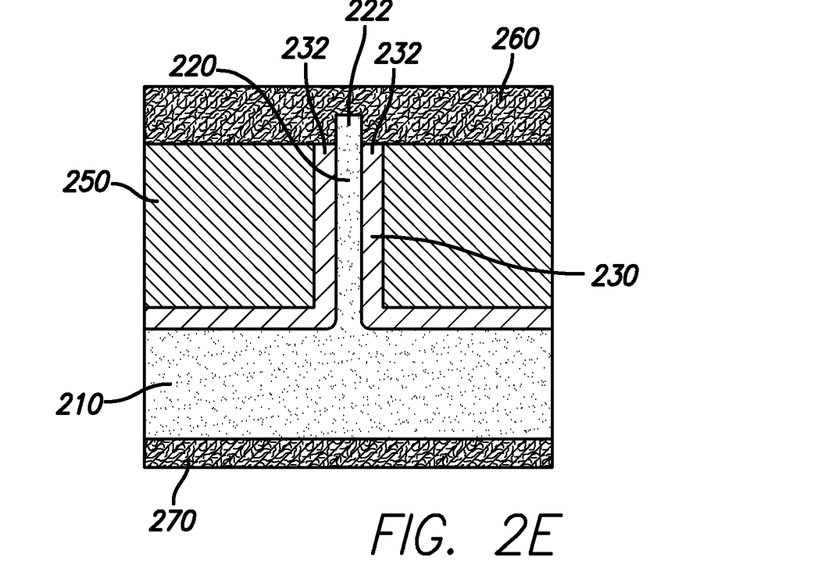
FIG. 2E shows an exemplary insulator passivated nanoscale pillar, wherein the insulator is coated with a dielectric, and the exposed portion of the end portion of the insulator and the nanoscale pillar are coated with a conductor.

FIG. 2E is a further cross-sectional view where a conductive layer (260) is coated, making contact with the dielectric (250), the end portion of the insulator (232) and the end portion of the nanoscale pillar (222). A backside contact (270) is present on the backside of the substrate (210), opposite the side from the insulator (230). In an optimized configuration, an amount of the insulator (30) material can be thickened to minimize gate capacitance.

Figure 3A:
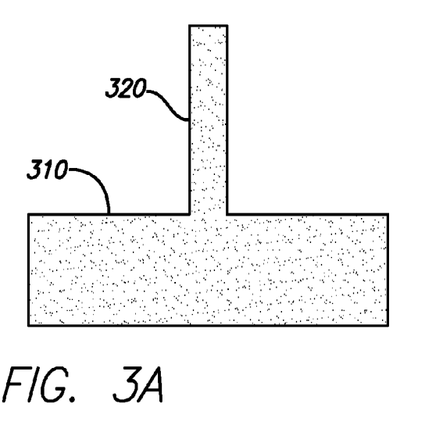
FIG. 3A shows an exemplary nanoscale pillar substrate.
Figure 3B:
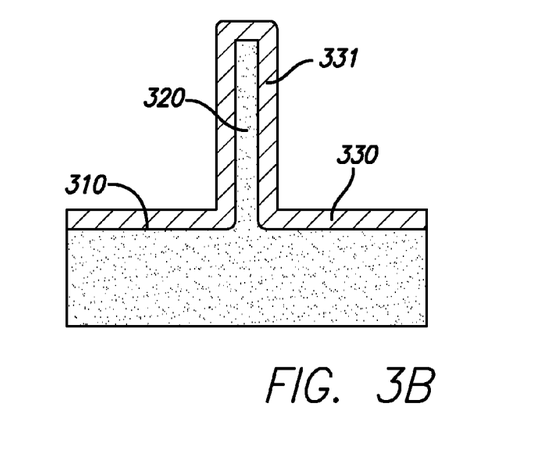
FIG. 3B shows an exemplary insulator passivated nanoscale pillar.

FIGS. 3A-3B are cross-sectional views of a nanoscale pillar (320) on a substrate (310) where the nanoscale pillar is covered by an insulator (330 & 331), as disclosed in FIGS. 1A-1B of this embodiment.

Figure 3C:
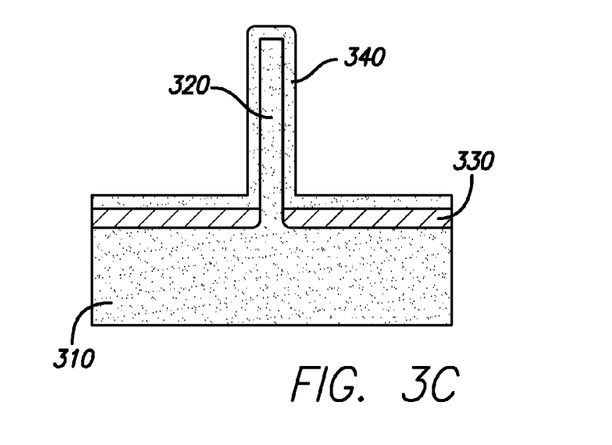
FIG. 3C shows an exemplary insulator passivated nanoscale pillar, wherein the nanoscale pillar and portions of the insulator are coated with a first conductive layer.

FIG. 3C is a further cross-sectional view where the insulator (331) layer on the nanoscale pillar portion is removed and a conductive layer (e.g., aluminum) is coated on the remaining insulator portion (330) and the nanoscale pillar (320).

Figure 3D:
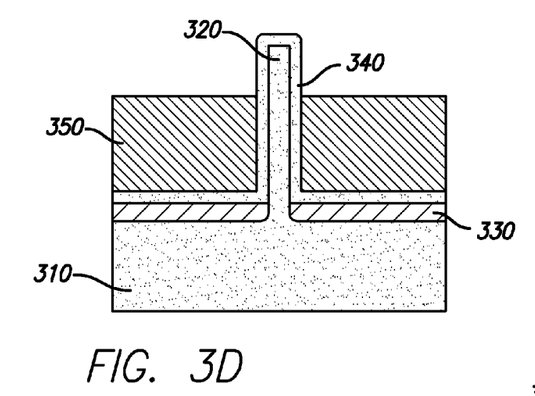
FIG. 3D shows an exemplary insulator passivated nanoscale pillar, wherein the first conductive layer is coated by a dielectric.

FIG. 3D is a further cross-sectional view where a dielectric (350) layer is coated on the conductive (340) layer.

Figure 3E:
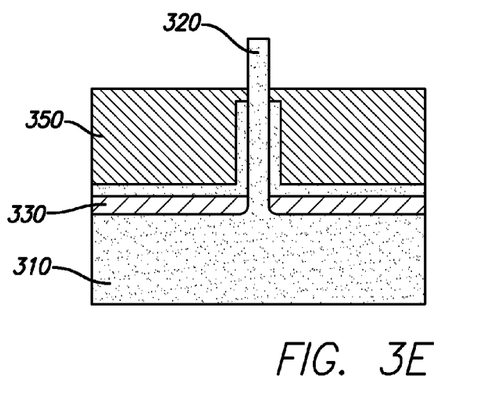
FIG. 3E shows an exemplary insulator passivated nanoscale pillar, wherein a portion of the first conductive layer protruding from the dielectric is removed.

FIG. 3E is a further cross-sectional view where a portion of the conductive (340) layer exposed above the dielectric (350) layer is removed, thereby exposing a protruding portion of the nanoscale pillar (320).

Figure 3F:
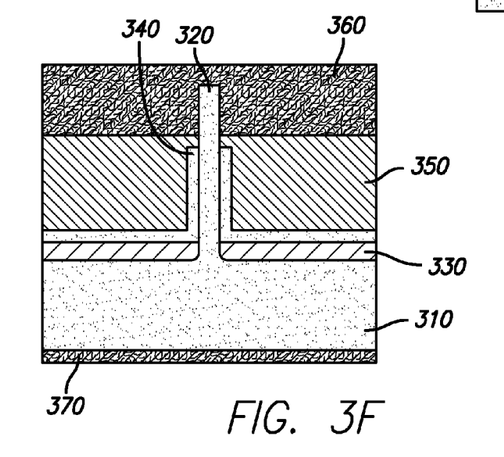
FIG. 3F shows and exemplary insulator passivated nanoscale pillar, wherein a second conductive layer is coated on the protruding portion of the nanoscale pillar and the dielectric.

FIG. 3F is a further cross-sectional view where a second conductive layer (360) is coated, making contact with the dielectric (350) layer and the exposed portion of the nanoscale pillar (320) but does not make contact with the first conductive (340) layer. A backside contact (370) is present on the substrate (310), opposite the side from the insulator (370) producing a metal-semiconductor (MES) structure which can be useful for a MESFET transistor. In an optimized configuration, an amount of the insulator (330) material can be thickened to minimize gate capacitance.

The examples set forth above are provided to give those of ordinary skill in the art a complete disclosure and description of how to make and use the embodiments of the present disclosure, and are not intended to limit the scope of what the inventors regard as their disclosure. Modifications of the above-described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

We claim:

1. A method for fabricating an electronic arrangement, comprising:
    providing one or more nanoscale pillars;
    coating the one or more nanoscale pillars with an insulator;
    depositing a first conductive layer on the insulator;
    coating a portion of the first conductive layer with a dielectric;
    removing an end portion of the first conductive layer and the insulator, thereby making electrically accessible a portion of the one or more nanoscale pillars; and
    depositing a second conductive layer on the dielectric, the second conductive layer contacting the electrically accessible portion of the one or more nanoscale pillars.

2. The method of claim 1, wherein the one or more nanoscale pillars are located on a substrate.

3. The method of claim 2, wherein a side opposite the nanoscale pillars on the substrate is coated with a conductive backside contact.

4. The method of claim 1, wherein the insulator is an oxide insulator.

5. The method of claim 4, wherein the first conductive layer acts as a gate of the electronic arrangement.

6. The method of claim 5, wherein gate material is chosen to exhibit a plasmon resonance coinciding with a band gap energy of the one or more nanoscale pillars.

7. The method of claim 1, wherein the electronic arrangement comprises one or more metal-oxide-semiconductor (MOS) structures, the first conductive layer acting as the metal of the one or more MOS structures, the insulator acting as the oxide of the one or more MOS structures, and the nanoscale pillar acting as the semiconductor of the one or more MOS structures.

8. The method of claim 7, wherein the one or more MOS structures are vertically oriented MOS structures, wherein each of the metal, oxide, and semiconductor of the one or more MOS structures extend in a vertical direction.

9. The method of claim 8, wherein the electronic arrangement comprises one or more field-effect transistors (FETs).

10. The method of claim 9, wherein the one or more nanoscale pillars act as a source or drain of the one or more FETs.

11. The method of claim 1, wherein the one or more nanoscale pillars comprise light emitting nanoscale pillars.

12. The method of claim 11, wherein the light is a visible light.

13. The method of claim 12, wherein the nanoscale pillar acts as an opto-electronic switch.

14. A method for fabricating an electronic arrangement, comprising:
    providing one or more nanoscale pillars;
    coating the one or more nanoscale pillars with an insulator;
    coating the insulator with a dielectric;
    removing an end portion of the insulator, thereby making electrically accessible a portion of the one or more nanoscale pillars; and
    depositing a conductive layer on the dielectric, the conductive layer contacting the electrically accessible portion of the one or more nanoscale pillars.

15. A method for fabricating an electronic arrangement, comprising:
    providing one or more nanoscale pillars;
    coating the one or more nanoscale pillars with an insulator;
    removing the insulator portion in contact with the nanoscale pillar;
    coating remaining insulator portion and an exposed portion of the nanoscale pillar with a first conductive layer;
    coating the conductive layer with a dielectric;
    removing an end portion of the first conductive layer, thereby making electrically accessible a portion of the one or more nanoscale pillars; and
    depositing a second conductive layer on the dielectric, the second conductive layer contacting the electrically accessible portion of the one or more nanoscale pillars.

16. A method of claim 15, wherein the first conductive layer acts as a gate of the electronic arrangement.

17. A method of claim 15, wherein the electronic arrangement comprises one or more metal-semiconductor (MES) structures, the first conductive layer acting as the metal of the one or more MES structures and the nanoscale pillar acting as the semiconductor of the one or more MES structures.

18. The method of claim 17, wherein the one or more MES structures are vertically oriented MES structures, wherein each of the metal and semiconductor or the one or more MES structures extend in a vertical direction.

19. The method of claim 18, wherein the electronic arrangement comprises one or more field-effect transistors (FETs).

* * * * *